United States Patent [19]
Goldberg et al.

[11] Patent Number: 5,651,019
[45] Date of Patent: Jul. 22, 1997

[54] SOLID-STATE BLUE LASER SOURCE

[75] Inventors: Lew Goldberg, Fairfax; Michael L. Dennis, Alexandria; Ishwar Aggarwal, Fairfax Station, all of Va.

[73] Assignee: The United States of America as represented by the Secretary of the Navy, Washington, D.C.

[21] Appl. No.: 430,953

[22] Filed: Apr. 28, 1995

[51] Int. Cl.$^6$ .................................................. H01S 3/14
[52] U.S. Cl. ........................... 372/68; 372/22; 372/97
[58] Field of Search .......................... 372/21, 22, 68, 372/97; 359/326

[56] References Cited

U.S. PATENT DOCUMENTS

| 4,879,722 | 11/1989 | Dixon et al. | 372/21 |
| 4,933,944 | 6/1990 | McGraw | 372/22 |
| 4,935,931 | 6/1990 | McGraw | 372/22 |
| 5,142,542 | 8/1992 | Dixon | 372/22 |
| 5,175,741 | 12/1992 | Okazaki | 372/75 |
| 5,345,457 | 9/1994 | Zenzie et al. | 372/22 |

OTHER PUBLICATIONS

Kean et al., "Generation of 20mW of Blue Laser Radiation from a Diode-Pumped Sum-Frequency Laser", Appl. Phys. Lett., vol. 63(3), pp. 302–304 (19 Jul. 1993).

Risk et al. "Diode Laser Pumped Blue-Light Source Based on Intracavity Sum Frequency Generation", Appl. Phys. Lett., vol. 54(9), pp. 789–791 (27 Feb. 1989).

Risk et al. "Generation of Blue Light by Intracavity Frequency Mixing of the Laser and Pump Radiation of a Miniature Neodymium: Yttrium Aluminum Garnet Laser", Appl. Phys. Lett., vol. 52(2), pp. 85–87 (11 Jan. 1988).

*Primary Examiner*—Akm E. Ullah
*Assistant Examiner*—Robert E. Wise
*Attorney, Agent, or Firm*—Thomas E. McDonnell; George Jameson

[57] ABSTRACT

A blue laser source outputting a beam having a wavelength of approximately 460 nm. A first laser cavity is formed around a Nd:YAG gain medium generating a first light beam having a wavelength of approximately 1064 nm. A second laser cavity, at least partially coextensive with the first laser cavity is formed around a Tm:ZBLAN gain medium generating a second light beam having a wavelength of approximately 810 nm. A non-linear KTP crystal is provided intracavity to both the first and second laser cavities to mix the first light beam and the second light beam and output a third light beam having a wavelength of approximately 460 nm. One of the mirrors forming the first or second laser cavity is coated to output a laser beam having a wavelength of approximately 460 nm.

16 Claims, 6 Drawing Sheets

SOLID-STATE BLUE LASER SOURCE

BACKGROUND OF THE INVENTION

1. Field of the Invention

The present invention relates to a blue laser source which efficiently generates laser radiation having a wavelength near 460 nm, and in particular, relates to a blue laser source using Thulium doped ZBLAN fluoride glass inside the cavity of a Nd:YAG gain medium.

2. Description of the Related Art

A laser generally comprises a gain medium producing a light beam and two mirrors defining a laser cavity around the gain medium to reflect a light beam back and forth through the gain medium. One of the mirrors, the exit mirror, is specially coated to allow a beam of light, the laser beam, having a predetermined wavelength to pass therethrough. The gain medium is pumped by a light source, such as a diode or another laser. Presently, the only lasers capable of emitting light in the blue spectral region are gas lasers such as an Argon ion laser, and a HeCd laser. However, these known blue gas lasers have a very low electrical to optical conversion efficiency, less than 0.01%. As such, these lasers require many kilowatts of electrical power to generate optical power in the watts range. Such high power requirements dictate that high powered blue gas lasers are only useful in limited laboratory applications. The usefulness of such blue gas lasers is also limited by the large amount of excess heat that has to be removed by the laser cavity. For example, known high-powered blue gas lasers typically have a cavity length in the range of one to two meters. When generating a laser above 100 mW of optical power, circulating water and external chillers are required. Air cooling, using a fan, has been successfully used for blue gas lasers outputting less than 100 mW of optical power, allowing use in applications such as high speed laser printing, IC wafer alignment, IC mask generators, and CD mastering systems. However, the known powered air cooled blue gas lasers still entail a relatively large cost and have a low efficiency. Further, due in part to the mechanical vibrations caused by the fan, known low powered air-cooled blue gas lasers have a relatively short lifetime of approximately 5000 hours. This limits the usefulness of the low powered air cooled blue gas lasers in commercial applications.

Several solid state alternatives to blue gas lasers have been proposed. These include: fiber upconversion lasers, directly frequency doubled laser diodes, sum frequency mixing between a Nd:YAG laser and a laser diode, and sum frequency mixing of laser diode emission with Nd:YAG power in an intracavity mounted nonlinear crystal. However, each of these systems has a maximum output power of 100 mW, due to the use of diffraction limited laser diode pumps which are limited to less than one watt of power. While the fiber upconversion laser can be pumped by a higher power Nd:YAG laser, its output power is limited by the high density in the small single mode fiber core which undergoes catastrophic fiber damage when the pump power exceeds a few watts.

SUMMARY OF THE INVENTION

Accordingly, it is an object of the present invention to provide an efficient generation of high powered visible and near infrared coherent radiation.

It is another object of the invention to provide a practical solid state source of blue light having high conversion efficiency and outputs in the multi-watt range.

It is a further object of the present invention to provide a solid-state blue laser source having an optical power conversion above two percent.

It is also an object of the present invention to provide a solid-state blue laser source with a minimum amount of excess heat, a compact size, and a lower overall system cost.

It is yet a further object of the present invention to provide a solid-state blue laser source suitable for use in large screen visual displays, optical data storage, optical printing, photolithography, medical and other scientific uses.

The additional objects and advantages of the present invention will be set forth in part in the description which follows, and, in part, will be obvious from the description, or may be learned by practice of the invention.

Objects of the invention are achieved in a blue laser source comprising a first laser having a first gain medium and a first laser cavity to generate a first beam having a wavelength of approximately 1064 nm, a second laser having a second gain medium and a second laser cavity to generate a second beam having a wavelength of approximately 810 nm, and a mixing unit to mix the first beam and the second beam and to output a third beam having a wavelength of approximately 460 nm.

Objects of the invention are also achieved in a blue laser source comprising a first gain medium outputting a first beam having a wavelength of approximately 1064 nm, a second gain medium outputting a second beam having a wavelength of approximately 810 nm, a non-linear crystal receiving both the first and second beams and outputting a beam having a wavelength of approximately 460 nm.

Objects of the invention are further achieved by a method of generating a laser beam having a wavelength of approximately 460 nm comprising forming a first laser which has a cavity, the first laser generating a first beam having a wavelength of approximately 1064 nm, forming a second laser which has a cavity which is at least partially coextensive with the cavity of the first laser, the second laser generating a second beam having a wavelength of approximately 810 nm, and mixing the first beam with the second beam where the cavity of the first laser overlaps the cavity of the second beam laser to produce a laser beam having a wavelength of approximately 460 nm.

BRIEF DESCRIPTION OF THE DRAWINGS

These and other objects and advantages of the invention will become apparent and more readily appreciated from the following description of the preferred embodiments, taken in conjunction with the accompanying drawings, of which.

DETAILED DESCRIPTION OF THE PREFERRED EMBODIMENTS

Reference will be now made in detail to the present preferred embodiments of the present invention, examples of which are illustrated in the accompanying drawings, wherein like reference numerals refer to like elements throughout.

Figure 1:
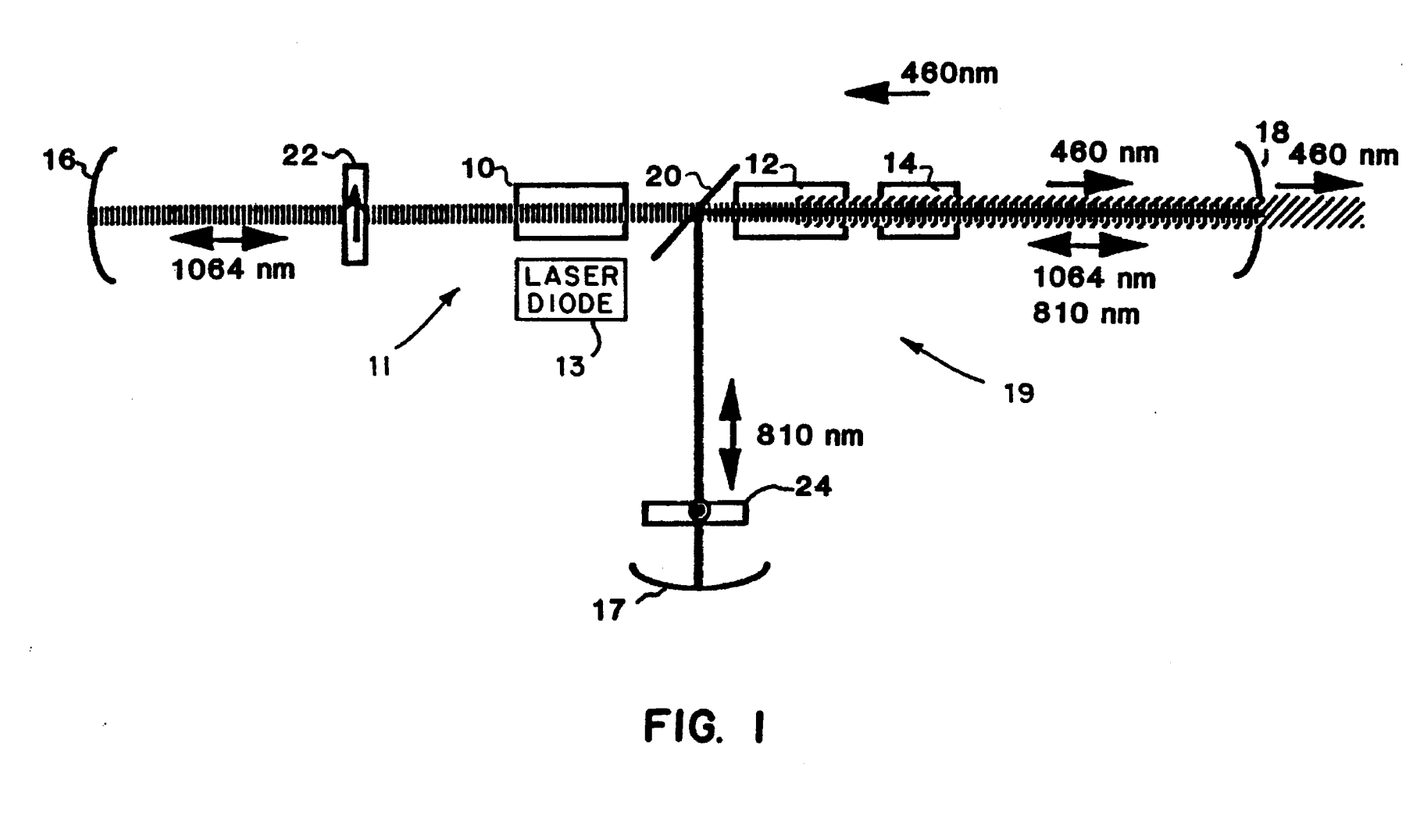
FIG. 1 is a block diagram of a solid state blue laser source in accordance with the first preferred embodiment of the present invention.

FIG. 1 is a block diagram of a solid state blue laser source in accordance with the first preferred embodiment of the present invention. A Nd:YAG gain medium 10 outputs a light beam (also referred to as a beam) with a 1064 nm wavelength and is positioned in a 1064 nm laser cavity 11 extending between a mirror 16 and an exit mirror 18 (also termed an output mirror or coupler mirror). The Nd:YAG crystal or gain medium 10 is preferably pumped by a laser diode 13. A Thulium doped ZBLAN fluoride glass 12 is positioned in the 1064 nm laser cavity with the Nd:YAG gain medium 10. The Thulium doped ZBLAN fluoride glass 12 serves as a gain medium when pumped by the Nd:YAG gain medium 10. The Nd:YAG gain medium 10 resonantly pumps the Tm:ZBLAN glass 12 with a beam having a wavelength of 1064 nm. A 810 nm lasing action is achieved in the Tm:ZBLAN glass 12 by creating a 810 nm laser cavity 19, extending between mirrors 17 and 18, which does not interfere with the operation of the Nd:YAG gain medium 10, using a dichroic beamsplitter 20 and a mirror 17. To generate a blue light beam having a wavelength near 460 nm, a non-linear KTP crystal 14 is placed at a position which is intracavity for both the 1060 nm Nd:YAG gain medium 10 and the 810 nm Tm:ZBLAN fluoride glass 12. The high resonant power of the two lasing wavelengths undergoes a non-linear frequency mixing in the KTP crystal 14, thereby generating a high powered sum frequency radiation having a wavelength near 460 nm.

The dichroic beamsplitter 20 has a near zero percent reflectivity at wavelengths equal to 1064 nm and a near one-hundred percent reflectivity at 810 nm. Further, the mirror 16 and the exit mirror 18 are nearly one-hundred percent reflective at wavelengths equal to 1064 nm, while the mirror 17 and the exit mirror 18 are one-hundred percent reflective at wavelengths equal to 810 nm. The exit mirror 18 has a near zero percent reflectivity at wavelengths equal to 460 nm.

To maximize the pump intensity, the Tm:ZBLAN glass 12 is placed in the 1064 nm cavity where the beam waist is at a minimum. The Tm:ZBLAN glass 12 is AR (antireflective) coated at 1064 nm to minimize cavity loss. The doping level and the length of the ZBLAN glass 12 is selected to achieve approximately 10 percent loss (double pass) for the circulating 1064 nm power. This configuration is equivalent to the use of a ten percent output coupler, commonly used in Nd:YAG lasers, resulting in near optimum power extraction from the Nd:YAG gain medium 10.

The KTP crystal 14 offers a wide phase matching bandwidth with temperature and sensitivity, and a large acceptance angle in an easily available, low cost non linear crystal. The placement of the KTP crystal 14 inside the 1064 nm laser cavity 11 and the 810 nm laser cavity 19 assures that the power of both wavelengths inside the crystal will be high. Sum frequency generation phase matching conditions in the KTP crystal 14 can be achieved for the two incident wavelengths and the sum frequency wavelengths when the polarizations of the two incident beams are linear and orthogonal. This is accomplished by placing appropriate polarizers 22 and 24 in each laser cavity 11 and 19. As both the 1064 nm and 810 nm beams propagate from both right to left and left to right through the crystal, both right-propagating and left-propagating 460 nm sum frequency radiation is generated by the crystal. The right-propagating blue beam is extracted as a laser beam by coating the exit mirror 18 such that it is transmissive at wavelengths equal to 460 nm.

Figure 2:
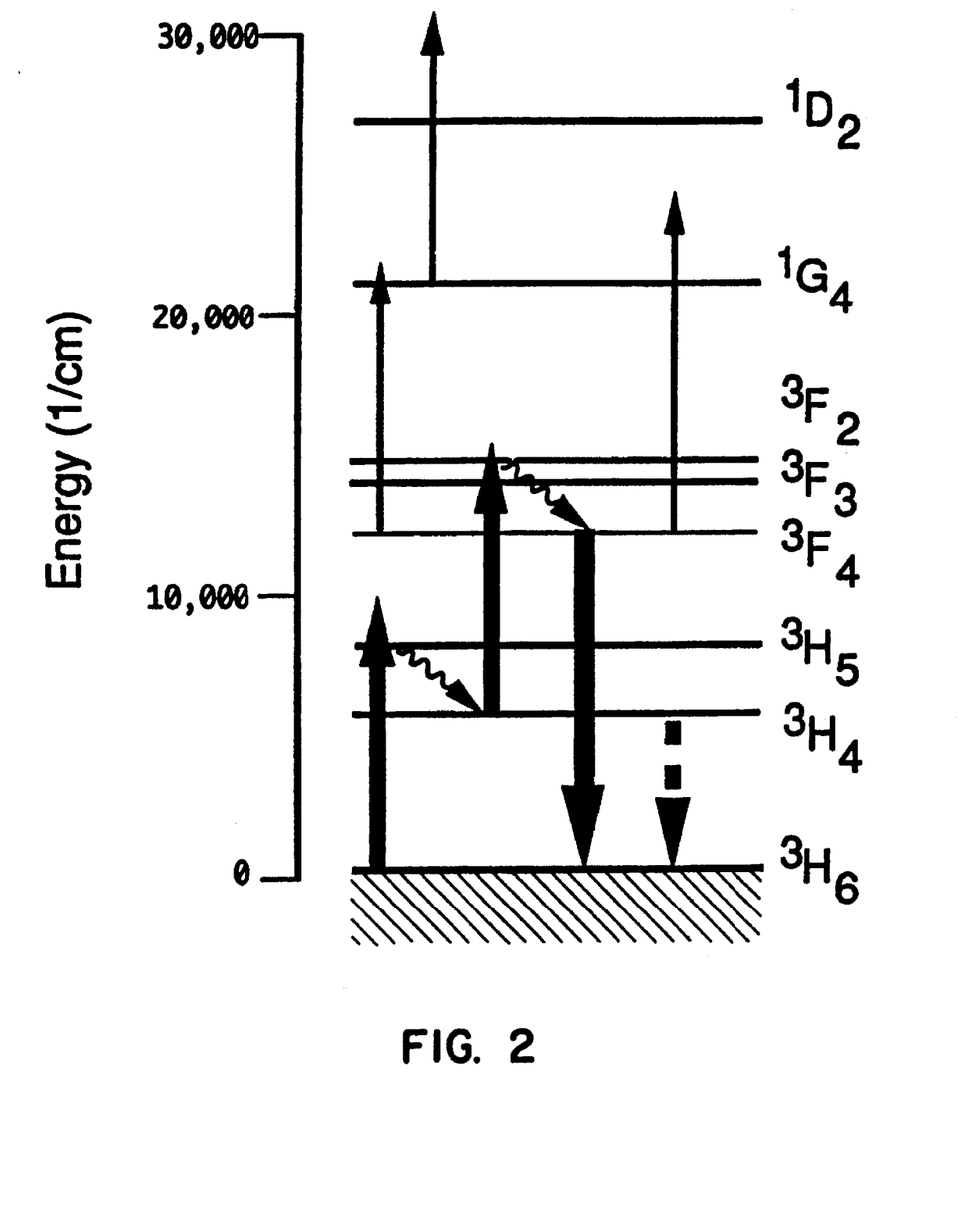
FIG. 2 is a chart of the transitions in a solid state blue laser source in accordance with the first preferred embodiment of the present invention.

FIG. 2 is an energy level diagram of the Tm:ZBLAN glass 12 as well as the transitions in the 1064 nm pumping scheme. The 1064 nm pump radiation initially promotes Tm atoms from the $^3H_6$ ground level or ground state to the $^3H_4$ level, then, through absorption of the second photon, to the $^3F_3$ level. The population in the $^3F_3$ level decays nonradioactively to the $^3F_4$ level which constitutes the upper energy level of the laser transition to the ground state. The laser transition is equivalent to a three level system with the ground energy level being the terminal state. As the ground state is the terminal point for the laser transition, it must be depleted to achieve population inversion required for optical gain and laser action. Such depletion can only occur in the presence of very high pump intensities, such as those occurring inside a 10 μm diameter core of a single mode fiber. Because of the high required pumping power densities, laser action in bulk Tm:doped ZBLAN is difficult to achieve, and has not been demonstrated. In accordance with the first preferred embodiment of the present invention, the bulk ZBLAN is placed inside a resonant cavity of the Nd:YAG pump laser. As the internal circulating power of the laser cavity (>100 W) is ten to one hundred times larger than the laser output power, ground state depletion and optical gain in the bulk Tm:ZBLAN can be achieved using a relatively low power Nd:YAG gain medium. While lamp pumped Nd:YAG gain mediums are most common, the electrical to optical conversion efficiency is significantly increased using a diode pumped Nd:YAG gain medium which provides a compact structure with a low cost.

The overall efficiency of the blue laser source, in accordance with the first preferred embodiment of the present invention, can be estimated as follows. Using a nonoptimized conversion efficiency of approximately 30% measured in 1064 nm pumped Tm:ZBLAN, and $\eta_{1060}$=10%, the conversion efficiency is $\eta_{810}$=3.0%. The nonlinear sum frequency conversion process converts the 1064 nm and 810 nm photons into 460 nm photons, where in the case of equal powers for the two wavelengths, each beam supplies approximately one half of the blue power generated. The conversion efficiency of the circulating infrared power into blue power can be estimated to be approximately $\eta_{460}$=40% from intracavity doubling results measured in a Nd:YAG gain medium. The overall laser system efficiency $\eta$ is given by:

$$\eta=0.5(\eta_{1060}+\eta_{810})\eta_{460}=2.6\%$$

At an output level of 10 W in the Nd:YAG crystal, a blue output power of 2.6 W should be generated.

The wavelength of the blue light generated by the solid state blue laser in accordance with the first preferred embodiment of the present invention is approximately 460 nm and can be tuned over approximately 5 nm, as allowed by the 10 nm gain spectral bandwidth of the Tm:ZBLAN gain medium. The emission wavelength is close to the peak response of the blue receptors in the human eye and is therefore ideal for visual display applications. Further, the laser emission wavelength also matches the 459 transmission window of a Cs atomic resonance filter making it well suited for underwater communication and surveillance applications.

Although the first embodiment of the present invention has been described with respect to a specific configuration, it will be recognized that the first embodiment is not limited to the specific configuration. For example, although the first embodiment has been described with respect to the use of a beamsplitter 20 in conjunction with two polarizing filters 22 and 24, one of ordinary skill in the art will recognize that the beamsplitter can be a polarizing type which allows a 1064 nm beam, polarized in the correct direction, to pass through, but reflects the 810 nm beam which has an orthogonal polarization. Further, one of ordinary skill in the art will recognize that if the generation of an external 810 nm laser beam is required, either the mirror 17 or the exit mirror 18 can be made partially transmissive at this wavelength to couple out some of the circulating power. Further, while Nd and Tm were described as host materials, other nonlinear crystals such as $KNbO_3$ can be used for the sum frequency generation of blue light. Also, while the Nd:YAG gain medium 10 was described as being pumped by a laser diode 13, a high intensity incandescent lamp may be used. Also, if another nonlinear crystal is used, which operates efficiently when the 810 nm beam and the 1064 nm beam are of the same polarization, the 810 nm laser cavity 19 can be co-extensive with the 1064 nm laser cavity 11. Also, while it is preferable to place the KTP crystal 14 in both the 1064 nm laser cavity 11 and the 810 nm laser cavity 19, the KTP crystal may be place outside the cavities 11 and 19 and the exit mirror 18 made transmissive at both 810 nm and 1064 nm.

Figure 3:
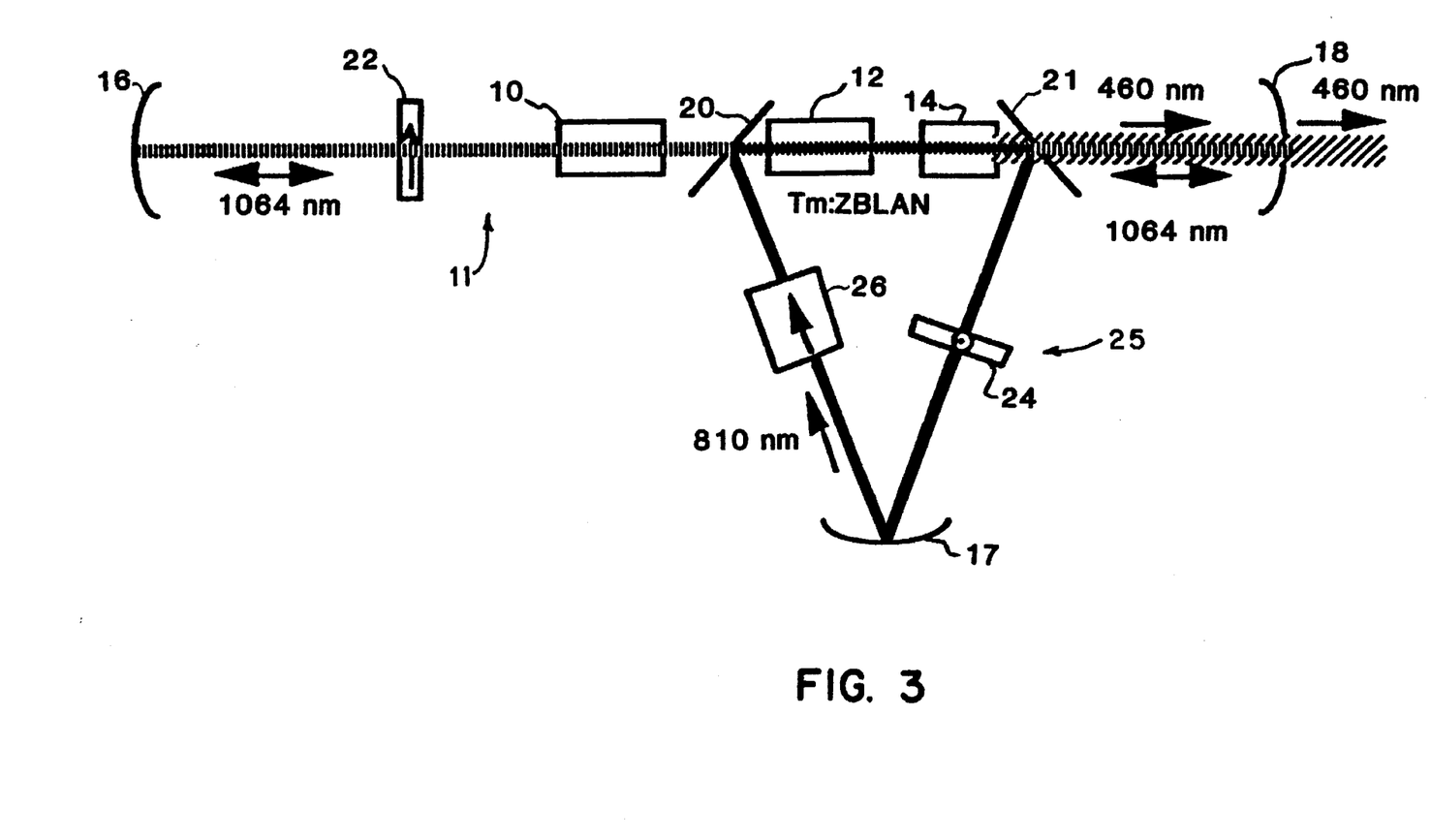
FIG. 3 is a block diagram of a solid state blue laser source in accordance with a second preferred embodiment of the present invention.

FIG. 3 is a block diagram of a solid state blue laser in accordance with a second preferred embodiment of the present invention. A 810 nm laser ring cavity 25 is formed, between the mirror 16 and the exit mirror 18, to allow the extraction of all the blue power in a single direction. A second dichroic beamsplitter 21, placed between the KTP crystal 14 and the exit mirror 18, is used to create a triangular path for the 810 nm light. Thus, the 810 nm laser ring cavity 25 is defined by the dichroic beamsplitters 20 and 21 and the mirror 17. An optical diode 26 is placed between the mirror 17 and the dichroic beamsplitter 20 to allow only clockwise propagation of power in the 810 nm laser ring cavity 25. Blue light, generated in the KTP crystal 14, propagates to the right and is coupled out of the laser through the dichroic beamsplitter 21 and the exit mirror 18. Both the dichroic beamsplitter 21 and the exit mirror 18 are transparent at 460 nm. The unidirectional cavity arrangement, in accordance with the second preferred embodiment, generates two times the blue power when compared with the solid state blue laser as set forth in the first preferred embodiment.

Although the second preferred embodiment has been described with respect to a specific configuration, it will be recognized that the second embodiment is not limited to the specific configuration. For example, although the second embodiment has been described with respect to the use of first and second dichroic beamsplitters 20 and 21 in conjunction with polarizing filters 22 and 24, one of ordinary skill in the art will recognize that polarization beamsplitters can be used without the polarization filters.

Figure 4:
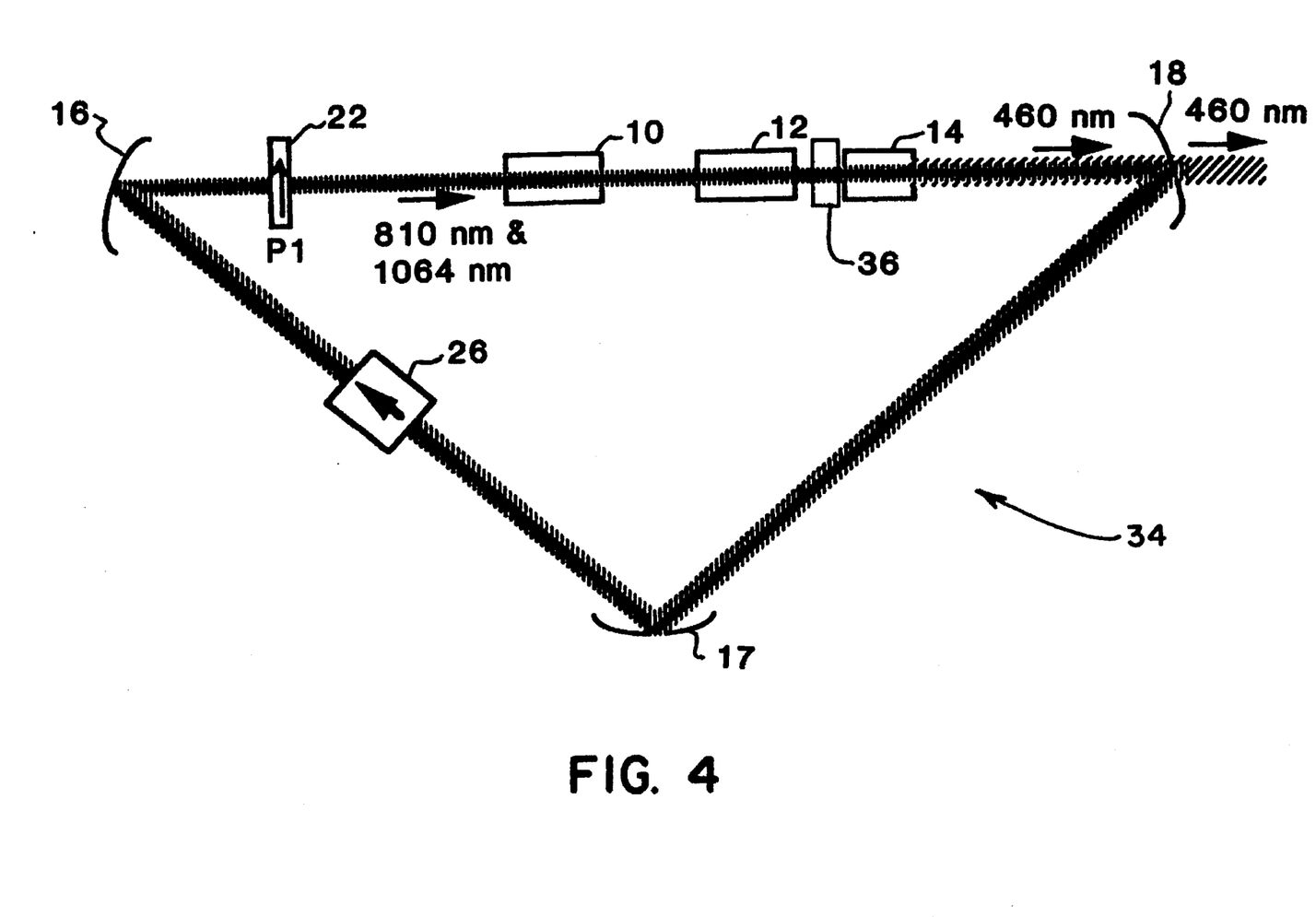
FIG. 4 is a block diagram of a solid state blue laser source in accordance with a third preferred embodiment of the present invention.

FIG. 4 is a block diagram of a solid state blue laser in accordance with a third preferred embodiment of the present invention. A dual wavelength resonant cavity 34 is created using the mirrors 16 and 17 and the exit mirror 18, all of which are highly reflective at both 810 nm and 1064 nm wavelengths. All of the dielectric surfaces within the cavity are coated at 1064 nm and 810 nm. A wavelength ($\lambda/2$) retardation plate 36 is preferably used to rotate the polarization of the 810 nm beam by 90° to provide the optimum output from the KTP crystal 14. The length of the Nd:YAG crystal 10 should be optimized to take advantage of the fact that the Nd:YAG absorption coefficient, at the pump wave length, is a factor of 10 larger than at 810 nm.

Although the third embodiment of the present invention has been described with respect to a specific configuration, it will be recognized that the third embodiment is not limited to the specific configuration. For example, although the third embodiment has been described with respect to the use of the nonlinear crystal KTP 14 being placed within the laser cavity 34, one of ordinary skill in the art will recognize that the nonlinear crystal KTP 14 can be placed outside of the laser cavity 34 and the 1064 nm and 810 nm laser emissions are outcoupled through a partially transmitting mirror 18. The sum frequency generation efficiency will be significantly lower but can be increased by operating the laser in mode lock, or q-switched, conditions, resulting in a high peak power and high signal passed nonlinear wavelength conversion efficiency.

Figure 5:
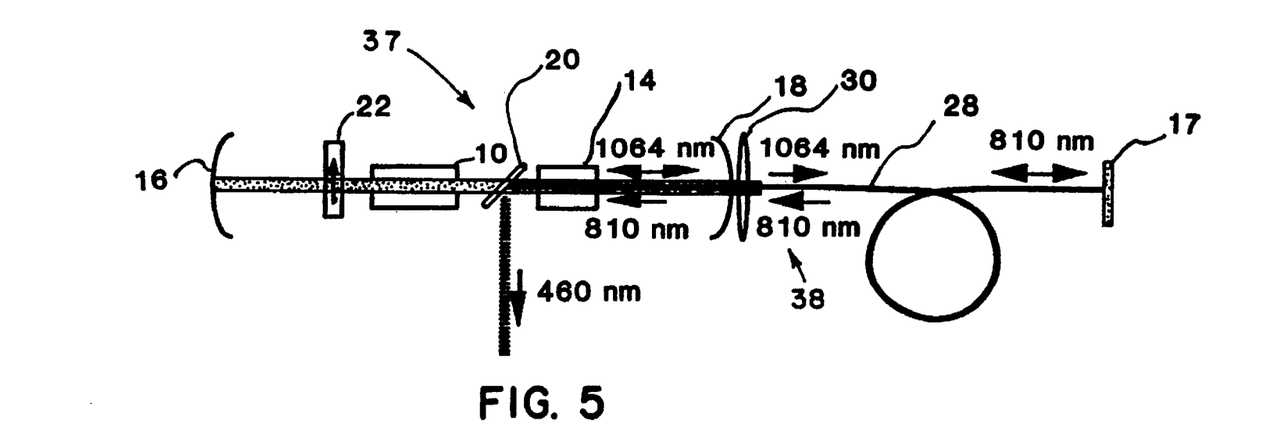
FIG. 5 is a diagram of a solid state laser source in accordance with a fourth preferred embodiment of the present invention.

FIG. 5 is a block diagram of a solid state blue laser in accordance with a fourth preferred embodiment of the present invention. Blue light is generated by mixing an 810 nm beam, generated by a Tm doped ZBLAN fiber 28 (acting as a laser) operating at 810 nm, placed outside of the 1064 nm laser cavity 37. The KTP crystal 14 is placed within the 1064 resonant cavity 37 which is formed between a 100% reflective mirror 16 and a 90% reflectively output exit mirror 18. After exiting the laser cavity, the 1064 nm beam is coupled into the fiber 28 via a coupler 30, preferably a lens, and an 810 nm laser cavity is formed between the 4% reflection from the cleaved front facet of the fiber 28 and the mirror 17 which is 100% reflective at wavelengths equal to 810 nm. The mirror 17 is made to be completely transmissive at wavelengths equal to 1064 nm to prevent the unabsorbed 1064 nm radiation from feeding back into the Nd:YAG gain medium 10. The 810 nm beam generated by the fiber 28 is coupled into the KTP crystal 14 through the mirror 18 which is completely transmissive for the 810 nm radiation. A dichroic beamsplitter 20 is used to couple out the blue sum frequency output of the Nd:YAG cavity. The dichroic beamsplitter 20 is completely transmissive at wavelengths equal to 1064 nm but 100% reflective at wavelengths equal to 460 nm.

Although the fourth embodiment of the present invention has been described with respect to a specific configuration, it will be recognized that the fourth embodiment is not limited to the specific configuration.

Figure 6:
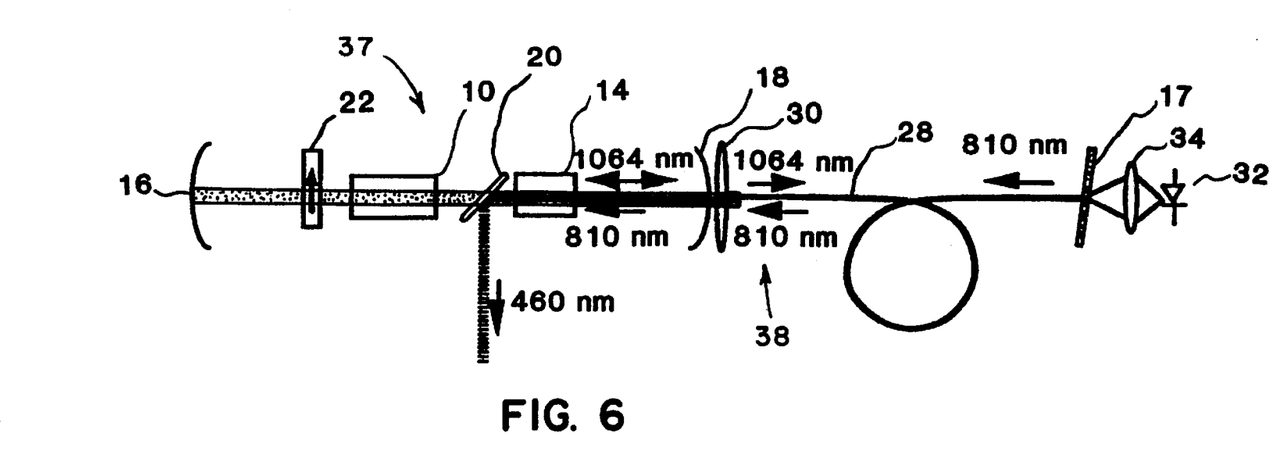
FIG. 6 is a diagram of a solid state blue laser source in accordance with a fifth preferred embodiment of the present invention.

FIG. 6 is a block diagram of a solid blue laser source in accordance with a fifth embodiment of the present invention. The mirror 17 is tilted approximately 10% to prevent the reflected 810 nm light from coupling back into the core of the fiber 28. Through the proper use of an index matching cement between the mirror and the fiber facet the reflection of the end of the fiber 28 is completely eliminated and the laser action in the fiber 28 is suppressed, in the absence of the laser action, the fiber 28 functions as a high gain amplifier. High power generation of 810 nm light is achieved by seeding the back end of the fiber 28 with a low powered 810 nm signal from a single mode laser diode 32, via a lens 34. An important advantage of using this configuration is that the single longitudinal mode seed signal generated by the laser diode 32 produces a single mode output from the fiber 28 amplifier, in contrast with a broad band emission. As the phase matching bandwidth of the KTP crystal 14 can be narrower than the spectral width of the fiber 28 output, the narrower bandwidth of the fiber 28 amplifier can result in a high non linear sum frequency generation efficiency and blue power. Further, the laser diode 32 can be modulated at high data rates, resulting in an intensity, i.e. amplitude, modulation of the seed signal, the 810 nm fiber 28 amplifier output, and therefore the blue light output power. This makes the device suitable for use in optical data storage and high definition large screen visual displays.

Figure 7:
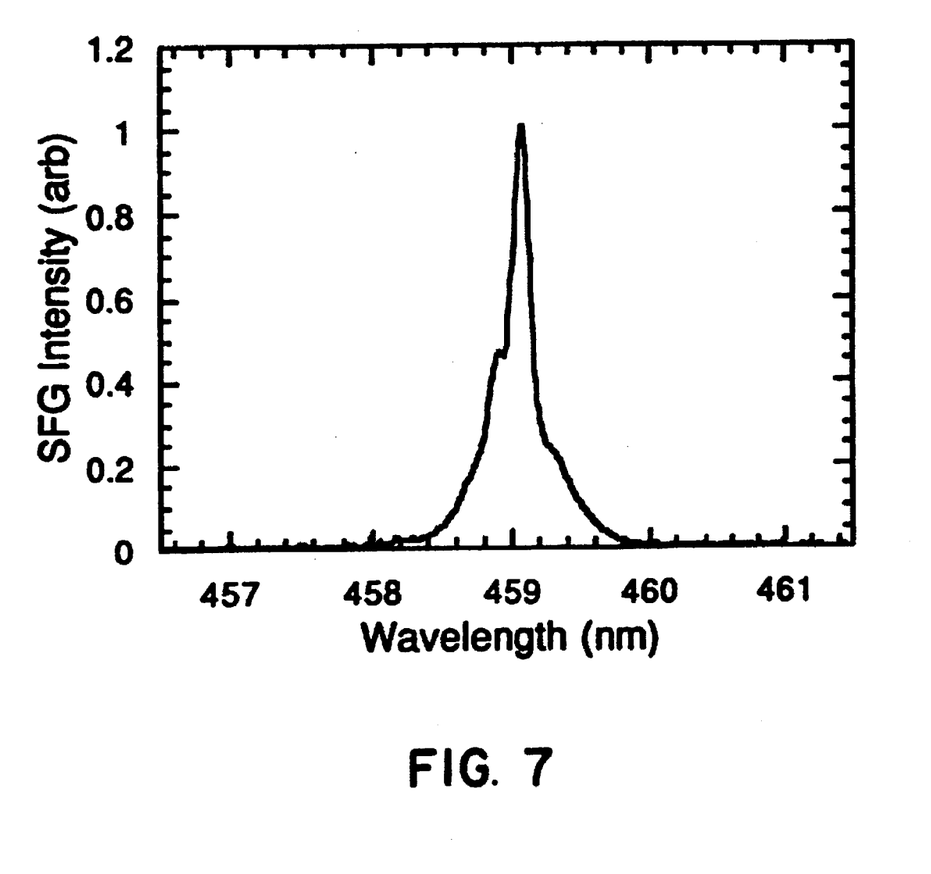
FIG. 7 is a graph of the measured spectrum of the strong blue SFG radiation of a solid state blue laser as shown in FIG. 6.

FIG. 7 is a chart of the strong blue SFG radiation outputted by a solid state blue laser as shown in FIG. 6.

Although the preferred embodiments have been shown and described, it would be appreciated by those skilled in the art that changes may be made in these embodiments without departing from the principles and spirit of the invention, the scope of which is defined in the claims and their equivalents.

We claim:

1. A blue laser source comprising:
   a first laser having a first gain medium and a first laser cavity to generate a first beam having a wavelength of approximately 1064 nm;
   a second laser having a second gain medium and a second laser cavity to generate a second beam having a wavelength of approximately 810 nm, a portion of said second laser cavity overlapping a portion of said first laser cavity; and
   a mixing unit to mix the first beam and the second beam and to output a third beam having a wavelength of approximately 460 nm, said mixing unit being located where said second laser cavity overlaps said first laser cavity.

2. A blue laser source as set forth in claim 1, wherein said first laser cavity comprises:
   a first set of mirrors positioned around said first gain medium.

3. A blue laser source as set forth in claim 2, wherein said second laser cavity comprises:
   a second set of mirrors positioned around said second gain medium.

4. A blue laser source as set forth in claim 3, wherein said second laser cavity overlaps a portion of said first laser cavity.

5. A blue laser source as set forth in claim 3, wherein the third beam is extracted by coating one mirror in one of said first and second set of mirrors such that it is transmissive at 460 nm.

6. A blue laser source as set forth in claim 3, wherein the third beam is extracted using a dichroic beamsplitter.

7. A blue laser source comprising:
   a first laser having a first gain medium and a first laser cavity to generate a first beam having a wavelength of approximately 1064 nm, said first gain medium being formed of Nd:YAG;
   a second laser having a second gain medium and a second laser cavity to generate a second beam having a wavelength of approximately 810 nm, said second gain medium being formed of Tm:ZBLAN, a portion of said second laser cavity overlapping a portion of said first laser cavity; and
   a mixing unit to mix the first beam and the second beam and to output a third beam having a wavelength of approximately 460 nm.

8. A blue laser source comprising:
   a first laser having a first gain medium and a first laser cavity to generate a first beam having a wavelength of approximately 1064 nm, said first gain medium being formed of Nd:YAG;
   a second laser having a second gain medium and a second laser cavity to generate a second beam having a wavelength of approximately 810 nm, said second gain medium being formed of Tm:ZBLAN, a portion of said second laser cavity overlapping a portion of said first laser cavity; and
   a mixing unit to mix the first beam and the second beam and to output a third beam having a wavelength of approximately 460 nm, said mixing unit being a non-linear KTP crystal.

9. A blue laser source comprising:
   a first gain medium outputting a first beam having a wavelength of approximately 1064 nm;
   a second gain medium outputting a second beam having a wavelength of approximately 810 nm, said second gain medium being pumped by said first gain medium; and
   a non-linear crystal receiving both the first and second beams and outputting a beam having a wavelength of approximately 460 nm.

10. A blue laser source as set forth in claim 9, wherein said second gain medium is seeded by a laser diode.

11. A blue laser source as set forth in claim 9, wherein said first gain medium is formed of Nd:YAG.

12. A blue laser source as set forth in claim 9, wherein said non-linear crystal is formed of KTP.

13. A blue laser source comprising:
   a first gain medium outputting a first beam having a wavelength of approximately 1064 nm;
   a second gain medium outputting a second beam having a wavelength of approximately 810 nm, said second gain medium being pumped by said first gain medium, said first gain medium being pumped by a laser diode; and
   a non-linear crystal receiving both the first and second beams and outputting a beam having a wavelength of approximately 460 nm.

14. A blue laser source comprising:
   a first gain medium outputting a first beam having a wavelength of approximately 1064 nm;
   a second gain medium outputting a second beam having a wavelength of approximately 810 nm, said second gain medium being a doped fiber; and
   a non-linear crystal receiving both the first and second beams and outputting a beam having a wavelength of approximately 460 nm.

15. A blue laser source comprising:
   a first gain medium outputting a first beam having a wavelength of approximately 1064 nm;
   a second gain medium outputting a second beam having a wavelength of approximately 810 nm, said second gain medium being a doped fiber, wherein said doped fiber is ZBLAN fluoride glass doped with Tm; and
   a non-linear crystal receiving both the first and second beams and outputting a beam having a wavelength of approximately 460 nm.

16. A method of generating a laser beam having a wavelength of approximately 460 nm comprising:
   forming a first laser which has a cavity, the first laser generating a first beam having a wavelength of approximately 1064 nm;
   forming a second laser which has a cavity which is at least partially overlapping with the cavity of the first laser, the second laser generating a second beam having a wavelength of approximately 810 nm; and mixing the first beam with the second beam where the cavity of the first laser overlaps the cavity of the second beam laser to produce a laser beam having a wavelength of approximately 460 nm.

* * * * *